United States Patent [19]
Cook et al.

[11] Patent Number: 4,887,144
[45] Date of Patent: Dec. 12, 1989

[54] TOPSIDE SUBSTRATE CONTACT IN A TRENCHED SEMICONDUCTOR STRUCTURE AND METHOD OF FABRICATION

[75] Inventors: Brian E. Cook, Houston, Tex.; Ralph S. Keen, Greensboro, N.C.

[73] Assignee: Texas Instruments Incorporated, Dallas, Tex.

[21] Appl. No.: 21,568

[22] Filed: Feb. 27, 1987

Related U.S. Application Data

[63] Continuation of Ser. No. 759,524, Jul. 26, 1985, abandoned.

[51] Int. Cl.⁴ .................................... H01L 27/04
[52] U.S. Cl. ................................ 357/50; 357/34; 357/49; 357/52
[58] Field of Search .................. 357/49, 34, 50, 52, 357/55

[56] References Cited

U.S. PATENT DOCUMENTS

| | | | |
|---|---|---|---|
| 4,288,807 | 9/1981 | Enzlin et al. | 357/49 |
| 4,424,621 | 1/1984 | Abbas et al. | 357/49 |
| 4,519,128 | 5/1985 | Chesebro et al. | 357/49 |

*Primary Examiner*—Edward J. Wojciechowicz
*Attorney, Agent, or Firm*—Melvin Sharp; Thomas W. DeMond; Lawrence J. Bassuk

[57] ABSTRACT

A process for forming a topside substrate contact in a trenched semiconductor structure. A trench (24, 26) is etched into a P- block of substrate (10) material. The trench (24, 26) is filled with silicon dioxide, and then the substrate material (10) circumscribed by the trench (24, 26) is removed to form a well. A subcollector (48) is implanted in the well of the P. substrate. Epi material (50) is grown in the well to the top of the silicon dioxide-filled trench. A device (59) is formed in the epi (50). Ohmic contacts (70) are formed on the topside of the substrate to the device (59) within the well, and to the P- substrate itself outside the trench.

6 Claims, 2 Drawing Sheets

TOPSIDE SUBSTRATE CONTACT IN A TRENCHED SEMICONDUCTOR STRUCTURE AND METHOD OF FABRICATION

This application is a continuation, of application Ser. No. 06/759,524, filed July 26, 1985, now abandoned.

TECHNICAL FIELD OF THE INVENTION

The present invention relates in general to integrated circuits and fabrication processes, and more particularly relates to devices fabricated in connection with dielectric isolating trenches.

BACKGROUND OF THE INVENTION

Recent advancements in Large Scale Integration (LSI) techniques have made possible the integration of a host of circuit functions on a single integrated chip. Indeed, according to modern fabrication techniques, it is possible to fabricate as many as 500,000 transistors on a single one centimeter square silicon chip. The high density packing of many circuits on a chip is met with the attendant problems of cross-talk and electric isolation between the circuits.

Dielectric isolation techniques have become well known in the semiconductor fabrication art for providing electrical isolation between various circuits on a chip. Specifically, the provision of oxide-filled trenches in a semiconductor substrate provides "tanks" of appropriately doped materials isolated from other similar tanks. These trenching techniques have been developed to the extent that circuits may be separated by tank walls of only two to three microns wide. This small dielectric spacing provides both an increase in the circuit densities, as well as a reduction in electrical interference between circuits.

Various prior trenching techniques are disclosed U.S. Pat. Nos. 4,318,751 to Horng; 4,356,211 to Riseman; 4,389,281 to Anantha et al; 4,473,598 to Ephrath et al; and 4,506,435 to Pliskin et al. In the noted patents, trenches are formed in a P− substrate having N+ and N− processed layers thereon. With the processes and structures disclosed in the noted patents, it is seen that the basic substrate block of P−, N+ and N− layers are formed before the trenching is done. Therefore, the bottom P− substrate becomes inaccessible from the top side for providing an ohmic contact thereto. The provision of an ohmic contact on the bottom of the substrate is possible; however, such an approach leads to a complicated metallic lead frame and mounting procedure.

There is therefore a need for an improved technique for making ohmic connections to the substrate material in trenched semiconductor structures.

There is also concomitant need for a semiconductor structure employing dielectric isolation tanks wherein a deep trench is initially formed into an unprocessed P− substrate, thereby leaving such substrate material near the top surface of the structure.

SUMMARY OF THE INVENTION

In accordance with the present invention, a trenched semiconductor structure and method of forming the same are provided which substantially reduce or eliminate problems associated with prior techniques.

In accordance with the invention, an improved semiconductor structure is provided by forming trenches in a block of P− substrate material to form the walls of a tank. The trenches are filled by depositing silicon dioxide therein. The P− substrate material between the trenches is then etched to remove a major part of the substrate material within the tank. Next, a "buried collector", or subcollector of N+ silicon, is formed by an ion implantation process within the substrate in the bottom of the tank. This buried collector does not extend below the trench walls. The subcollector extends from wall to wall between the silicon dioxide-filled trenches.

A lightly-doped N layer is grown by epitaxial techniques atop the N+ subcollector, and is grown to the top of the silicon dioxide-filled trench. Various masks are prepared on the epitaxial layer for forming therein the emitter, base and collector regions of a transistor device.

During the same step that the base region is formed, areas for ohmic contact can be formed in the P− substrate outside of the trenches surrounding the epitaxial layer. After all contacts have been opened, a layer of platinum silicide is formed in all contacts, followed by a deposition of a barrier layer, such as a titanium tungsten alloy, and a layer of aluminum. The aluminum and titanium tungsten layers are etched into a desired pattern, thereby providing electrical contacts at a convenient location atop the substrate block.

BRIEF DESCRIPTION OF THE DRAWINGS

For a more detailed description of the present invention and for further objects and advantages thereof, reference is now made to the following description taken in conjunction with the accompanying drawings, in which.

DETAILED DESCRIPTION OF THE INVENTION

Figure 1:
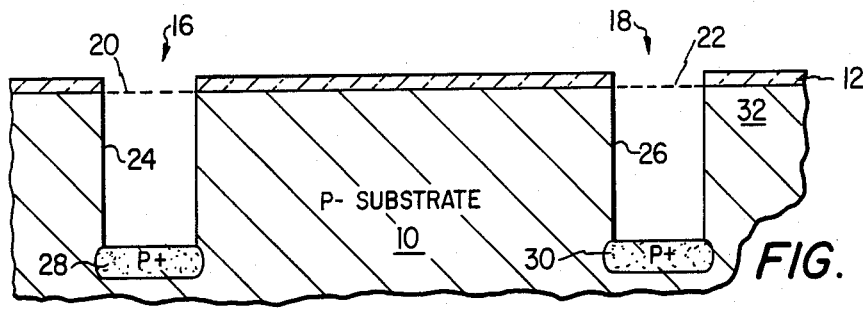
FIG. 1 is a diagrammatic cross-sectional illustration of a trenched P− substrate material.

Referring to FIG. 1, there is illustrated a portion of the semiconductor substrate 10 forming the basic substructure of the device described below. While the invention will be described in terms of specifically doped layers and regions of N and P type materials, it is to be understood that other doped layers and regions may be formed as desired to satisfy particular needs. Moreover, while the invention will be described in terms of a bipolar transistor device, such a device is merely exemplary.

The principles and concepts will apply as well to other devices and to Metal Oxide Semiconductor (MOS) and Complimentary Metal Oxide Semiconductor (CMOS) fabrication techniques. It should be noted at the outset that the various dimensional characteristics of the drawings are not to scale, but rather are drawn to clearly illustrate the invention.

The substrate 10 shown in FIG. 1 is a monocrystalline silicon <100> material prepared according to conventional techniques to form a P− type of substrate. In preparation of the trenching process, a silicon dioxide ($SiO_2$) layer 12 is formed on the P− substrate 10. The silicon dioxide layer 12 is formed by conventional technique, such as by subjecting the substrate to wet oxygen at a temperature of approximately 1000° C. Alternatively, a silicon dioxide layer can be deposited on the P− silicon substrate 10 by known Chemical Vapor Deposition (CVD) methods. The silicon dioxide layer 12 thus formed is preferably about 8000 Å deep.

On the top surface of the silicon dioxide layer 12, a photoresist masking layer (not shown) is applied to define areas in which it is desired to form a trench into the P− substrate 10. In the preferred embodiment of the invention, the mask process can be conducted in accordance with conventional photolithographic processes employing polymerization of the photoresist through a photographic mask with ultraviolet light, or the like. The unpolymerized film is easily removed, and the remaining polymer covers areas where it is desired that the P− substrate remain unaffected by subsequent processes. Areas 16 and 18 represent those areas where it is desired to form a trench into the P− substrate 10. A dry or wet etch is applied to the masked surface and allowed to etch through the exposed areas, and through the silicon dioxide layer 12. The photoresist mask is then removed from the top of the silicon dioxide layer 12 by a suitable etching solution.

As a result of the foregoing process, openings 16 and 18 are formed in the silicon dioxide layer 12 whereby the P− substrate is exposed as noted by broken lines 20 and 22.

With selected areas of the P− substrate exposed, the silicon substrate is subjected to a Reactive Ion Etching (RIE) process which anisotropically removes the P− substrate 10 in the area directly below the openings 16 and 18. The RIE process can be applied using a plasma gas of either $CCl_4+Cl_2$ gas, or $SiCl_4+SF_6$ gas. This trenching technique provides substantially vertical sidewalls forming trenches 24 and 26. It has been found that the RIE process is superior over a wet etch of the substrate 10, as lateral erosion of the substrate 10 does not occur. It is well known that the RIE process does not have the isotropic characteristics of the wet etch process.

In the preferred form of the invention, the deep trenches 24 and 26 are about two microns wide and eight microns deep. It is to be noted that the drawings depict cross-sectional views of the substrate 10, and thus it appears that the trenches 24 and 26 are two separate structures. In practice, however, the trench is a single circumferencial structure encircling a substrate area denoted by a well or tank which is isolated from the substrate material outside the trench. At the bottom of each such trench 16 and 18, P+ regions 28 and 30 are formed by the implantation of boron ions to prevent depletion of the ion as a result of subsequent processing of the substrate 10. The P+ regions 28 and 30 thus function as channel stops.

Next, the silicon dioxide layer 12 is removed by a conventional chemical etch. Departing from conventional practice, it is to be noted from FIG. 1 that the trenches 24 and 26 are formed into the raw P− substrate 10, rather than through heavily and/or lightly doped N and P layers. Notably, the P− substrate located outside the trench, such as identified by reference character 32, is readily accessible from the top during later processing for attachment of ohmic contacts thereto.

Figure 2:
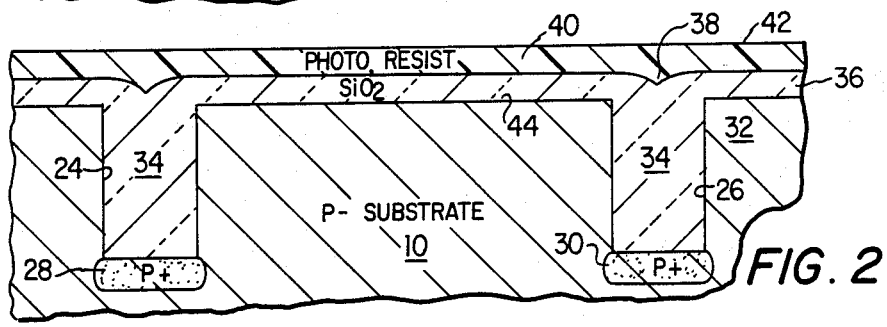
FIG. 2 is a sectional view of the trenched and silicon dioxide-filled substrate, prior to top surface planarization.

Continuing with the fabrication process, FIG. 2 illustrates the filling of trenches 24 and 26 with a dielectric material of silicon dioxide 34. This is accomplished by the low pressure chemical vapor deposition process. The LPCVD process is preferred, as the silicon dioxide deposition takes place from the bottom of the trenches upwardly, and from the sides of the trenches inwardly. In this manner, the silicon dioxide 34 completely fills each trench without leaving central air gaps or voids. A homogeneous column of silicon dioxide 34 thus fills each trench 24 and 26. The silicon dioxide deposited during the LPCVD process also forms a covering or layer 36 on the top surface of the P− substrate 10, as noted in FIG. 2. The deposition of silicon dioxide 34 merges with the previous silicon dioxide layer 12, thereby forming a uniform upper substrate covering 36.

Because of the lateral formation of the silicon dioxide 34 in the trench, a cusp 38 is formed above the central part of the trench, such as shown above trench 26. The cusp 38 is undesirable as it is a potential source of trouble in forming metallization patterns thereover. The cusped areas provide the potential for cracked and fractured metal paths.

In planarizing the top surface of the silicon dioxide 36 to remove the cusp 38, a photoresist 40 is spun over the silicon dioxide surface 36 according to well-known methods. The photoresist material 40 may also be of a conventional type used for such purposes, so long as it can be spread over the silicon dioxide surface 36 and result in a uniform smooth top surface 42. In addition, and to be discussed in detail below, it is necessary that the photoresist material 40 have an etch rate the same as that of the silicon dioxide layer 36. Conventional photoresists are available, and have been used for similar purposes.

Because it is contemplated that a plasma reactive ion etch technique will be used for planarizing the silicon dioxide cover layer 36, it is thus necessary that the photoresist material 40 and the silicon dioxide 36 have substantially a 1:1 etch ratio. During the RIE process of etching the photoresist 40 and the silicon dioxide 36, the plasma species are monitored to determine the existence of silicon substrate material 10 therein. The determination that the silicon substrate 10 itself is being etched is an indication that the photoresist material 40 and silicon dioxide surface 36 have been completely removed, whereupon the etching process is stopped. After such RIE etching, the top surface 44 of the silicon substrate 10 is coplanar inside and outside of the silicon dioxide-filled trenches 24 and 26. In addition, and as a result of the RIE process, the top surface 44 of the substrate 10 is coplanar with that of the silicon dioxide in trenches 24 and 26. Thus, the entire top surface of the processed silicon substrate has been planarized.

Next, a masking layer of silicon dioxide 52 and 54 is deposited over the entire surface, patterned by conventional techniques and etched to define an area of silicon substrate 10 between trenches 24 and 26.

Figure 3:
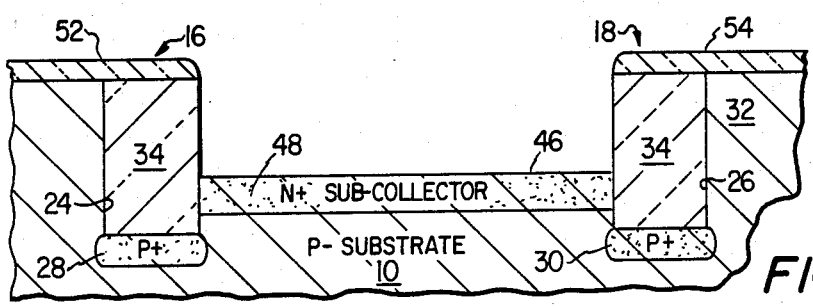
FIG. 3 is a cross-sectional view of the semiconductor substrate showing the removal of P− substrate material within the tank, and with the N+ subcollector layer formed therein.

In accordance with the next step of the invention, a portion of the silicon substrate 10 between the silicon dioxide-filled trenches 24 and 26 is removed, as shown in FIG. 3. Specifically, the silicon substrate 10 is removed to a depth of about 1-1.5 microns. The portion of silicon substrate material 10 removed will be later replaced by an epitaxial growth of doped silicon which will form the basis of a bipolar transistor therein. In FIG. 3, the silicon substrate 10 has been removed down to a level illustrated by reference character 46. A conventional wet or dry etch process may be used to remove the noted silicon substrate 10.

Proceeding with the fabrication process, a buried N+ subcollector 48 is next formed into the silicon substrate 10 between the silicon dioxide-filled trenches 24 and 26. The buried subcollector 48 is formed by implanting ions, such as arsenic, into the silicon substrate 10 so that a high concentration N+ region is formed. The buried subcollector thus formed is about three to four microns deep. After implantation of the arsenic ions, the subcollector 48 is annealed at about 1250° C. to activate the ions and recrystallize the structure surface. The annealing step is conducted in a high temperature non-oxidizing ambient, such as nitrogen.

Figure 4:
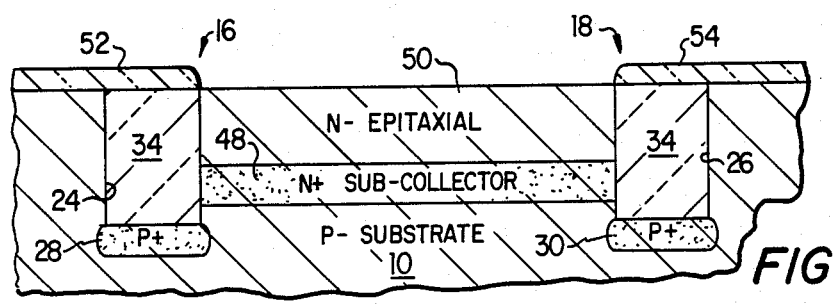
FIG. 4 is a cross-sectional view of the semiconductor material showing the next process step as the filling of the isolation tank with an epitaxial layer of N− material.

FIG. 4 illustrates the deposit of an epitaxial layer 50 on the N+ subcollector 48, the layer 50 being grown upwardly to a level even with the top surfaces of the silicon dioxide-filled trenches 24 and 26. The silicon dioxide 52 and 54 prevents the growth of epitaxial material except where exposed single crystal silicon exists, i.e., on top of the N+ subcollector 48. The single crystal epi is selectively grown on the subcollector 48 at a temperature of about 900° C. The growth continues until the epi has completely replaced the substrate material previously removed. The process parameters in an epi reactor can be closely controlled so that after a predetermined period of time, it is known that the 1-1.5 microns of N epitaxial material have been grown. The epitaxial layer 50 is denoted as N− to show its doping level with respect to that of the subcollector 48. A dopant concentration is chosen such that an N− material resistivity of about 0.5 ohm-cm is achieved. After having selectively grown the N− epitaxial layer 50 on the subcollector 48, the structure is similar to that shown in FIG. 4.

Figure 5:
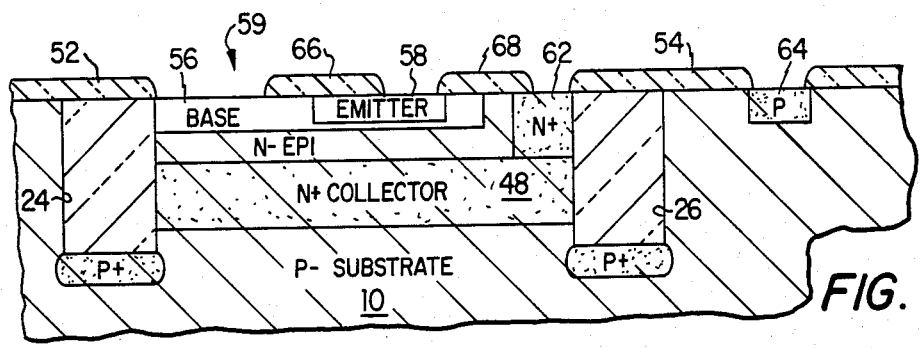
FIG. 5 is a cross-sectional view of the semiconductor substrate illustrating the transistor base, emitter and collector regions formed within the epitaxial layer, and with a P region formed outside the isolation tank.

FIG. 5 illustrates the structure of the semiconductor substrate after various ion implants or diffusions for forming the base 56 and emitter 58 regions of the exemplary bipolar transistor. It is to be understood that the invention is not limited to the formation of transistor circuits between the silicon dioxide-filled trenches 24 and 26, but passive circuit elements such as resistors and capacitors may also be formed. In addition to the transistor regions, there is also formed into the semiconductor substrate an N+ region 62 and a P region 64. These regions function as interface areas for connecting metallic paths to the respective transistor and silicon substrate 10 areas of the substrate. It is also to be understood that N channel MOS devices could be formed in the substrate region 32 outside trenches 24 and 26.

Figure 6:
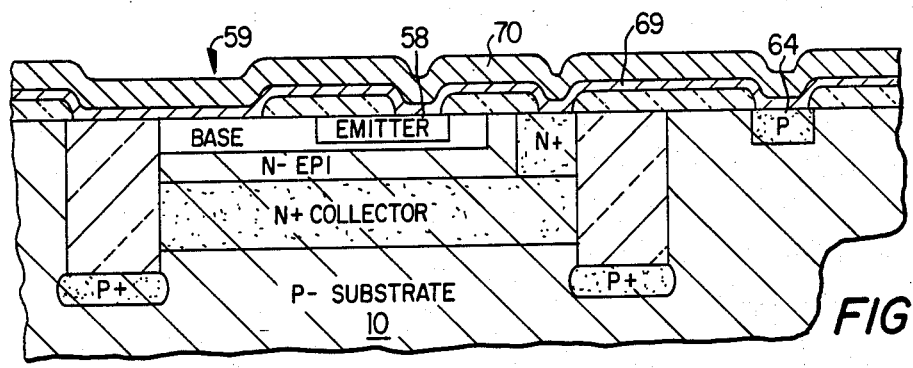
FIG. 6 is a cross-sectional view of the semiconductor substrate showing the metallization of the top surface of the semiconductor substrate for contacting the transistor regions within the isolation tank, and for contacting the substrate material outside the tank.
Figure 7:
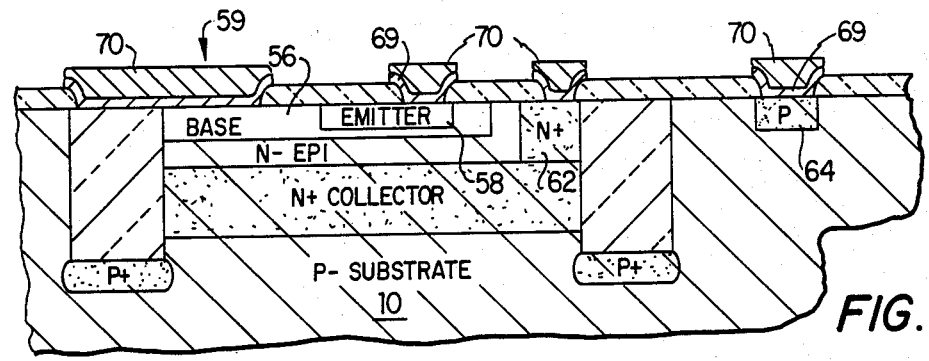
FIG. 7 is a cross-sectional side view of a portion of the completed semiconductor substrate according to the invention.

With reference to FIG. 6, after all contact regions 56, 58, 62, 64 have been opened, a layer of platinum silicide is formed in the contact openings by depositing platinum (not shown) and sintering at about 450° C. Platinum silicide will reduce contact resistance to the silicon substrate. A barrier layer 69 is next deposited on the substrate using conventional techniques. The barrier layer 69 may be fabricated of a titanium-tungsten alloy and should be greater than 1500 Å thick. During the same step, a highly conductive layer 70, which can be fabricated of aluminum, is deposited over the barrier layer 69 to a thickness of about 7000 Å. The metalized substrate is then coated with a photoresist, and exposed with a mask to define the interconnect pattern. The aluminum and titanium-tungsten layers 70 and 69 are etched leaving the substrate as it appears in FIG. 7.

From the foregoing, a semiconductor structure has been provided which substantially enhances the quality of the electrical circuit, as well as the connection accessibility to the substrate. To that end, a semiconductor structure has been provided in which the doped layers have been formed after the trenching operation, and thus the temperatures, implantations and etching processes of the trench do not thereby interfere or degrade the electrical circuit elements. Moreover, because selected areas, such as areas outside the trenches, remain as unprocessed silicon substrate material, a connection thereto from the top side of the substrate can be easily made. The processes, dopant types and arrangements described throughout this disclosure are of course merely illustrative of the applications of the principles of the invention. Numerous other arrangements and steps may be taken by those skilled in the art without departing from the spirit and scope of the invention.

What is claimed is:

1. A trenched semiconductor structure, comprising:
   a silicon substrate of one conductivity type having a concentration of dopant, and a circumferential trench therein extending to a top surface thereof and wherein a top surface of said substrate within the trench is intermediate a bottom of the trench and a top surface of said trench outside of the trench;
   a column of isolating dielectric filling said trench to said top surface;
   an silicon subcollector region of a second conductivity type formed in a top surface of said substrate within said trench and above a bottom level of said trench;
   an epitaxial silicon region of a third conductivity type above said subcollector region, said epitaxial silicon region extending upwardly to a level coplanar with the top surface of said substrate;
   a device formed in said silicon epitaxial material region;
   ohmic contacts to said device on the top surface thereof and within said trench; and
   a further ohmic contact on the top surface of said substrate and to said substrate outside the trench.

2. The trenched semiconductor structure of claim 1 wherein the device is a bipolar device.

3. The trenched semiconductor structure of claim 1 further comprising a region of said first conductivity type formed at the surface of the substrate to interface said further ohmic contact to the substrate.

4. The trenched semiconductor structure of claim 1 further comprising a region of a fourth conductivity type at a bottom portion of the trench to serve as a channel stop region.

5. The trenched semiconductor structure of claim 1 wherein said further ohmic contact is coplanar with said ohmic contacts to said device.

6. The trenched semiconductor structure of claim 1 wherein said ohmic contacts to said device include an ohmic contact to said subcollector.

* * * * *